United States Patent
Briggs et al.

(10) Patent No.: US 9,984,935 B2
(45) Date of Patent: *May 29, 2018

(54) UNIFORM DIELECTRIC RECESS DEPTH DURING FIN REVEAL

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Michael Rizzolo, Albany, NY (US); Jay W. Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/583,595

(22) Filed: May 1, 2017

(65) Prior Publication Data

US 2017/0236756 A1 Aug. 17, 2017

Related U.S. Application Data

(63) Continuation of application No. 14/928,817, filed on Oct. 30, 2015, now Pat. No. 9,666,474.

(51) Int. Cl.
*H01L 21/8234* (2006.01)
*H01L 21/311* (2006.01)
(Continued)

(52) U.S. Cl.
CPC ........... *H01L 21/823481* (2013.01); *H01L 21/31116* (2013.01); *H01L 21/823431* (2013.01); *H01L 27/0886* (2013.01); *H01L 29/0653* (2013.01)

(58) Field of Classification Search
CPC ......... H01L 21/76232; H01L 21/30604; H01L 21/31051; H01L 29/0653; H01L 21/31116;
(Continued)

(56) References Cited

U.S. PATENT DOCUMENTS 8,319,311 B2   11/2012 Chen et al.
8,536,017 B2 *  9/2013 Kadoshima ....... H01L 21/76229
                                                  257/510
(Continued)

OTHER PUBLICATIONS

Redolfi, A., et al., "Bulk FinFET Fabrication with New Approaches for Oxide Topography Control Using Dry Removal Techniques," Solid-State Electronics, vol. 71, May 2012 (pp. 1-3).
(Continued)

*Primary Examiner* — Peter Bradford
(74) *Attorney, Agent, or Firm* — Tutunjian & Bitetto, P.C.; Vazken Alexanian

(57) ABSTRACT

A method for providing a uniform recess depth between different fin gap sizes includes depositing a dielectric material between fins on a substrate. Etch lag is tuned for etching the dielectric material between narrow gaps faster than the dielectric material between wider gaps such that the dielectric material in the narrow gaps reaches a target depth. An etch block is formed in the narrow gaps. The wider gaps are etched to the target depth. The etch block is removed.

10 Claims, 16 Drawing Sheets

(51) Int. Cl.
*H01L 27/088* (2006.01)
*H01L 29/06* (2006.01)

(58) Field of Classification Search
CPC ......... H01L 27/0886; H01L 21/823431; H01L 21/823481
See application file for complete search history.

(56) References Cited

U.S. PATENT DOCUMENTS

| | | |
|---|---|---|
| 8,815,742 B2 | 8/2014 | Cai et al. |
| 8,835,262 B2 | 9/2014 | Cai et al. |
| 8,946,829 B2 | 2/2015 | Wann et al. |
| 9,041,158 B2 | 5/2015 | Wann et al. |
| 2012/0032267 A1 | 2/2012 | Cheng et al. |
| 2012/0146090 A1 | 6/2012 | Lui et al. |
| 2013/0056826 A1 | 3/2013 | Liu et al. |
| 2013/0093043 A1* | 4/2013 | Kusaba ............ H01L 29/66181 257/508 |
| 2014/0151221 A1 | 6/2014 | Daamen et al. |
| 2014/0159171 A1* | 6/2014 | Cai ...................... H01L 29/785 257/412 |
| 2014/0231919 A1 | 8/2014 | Peng et al. |
| 2014/0306317 A1 | 10/2014 | Licausi |
| 2014/0315371 A1 | 10/2014 | Cai et al. |

OTHER PUBLICATIONS

List of IBM Patents or Patent Applications Treated as Related dated May 1, 2017, 2 pages.

Office Action issued in U.S. Appl. No. 15/583,638 dated Jul. 31, 2017.

Notice of Allowance issued in U.S. Appl. No. 15/583,638 dated Dec. 8, 2017, 10 pages.

\* cited by examiner

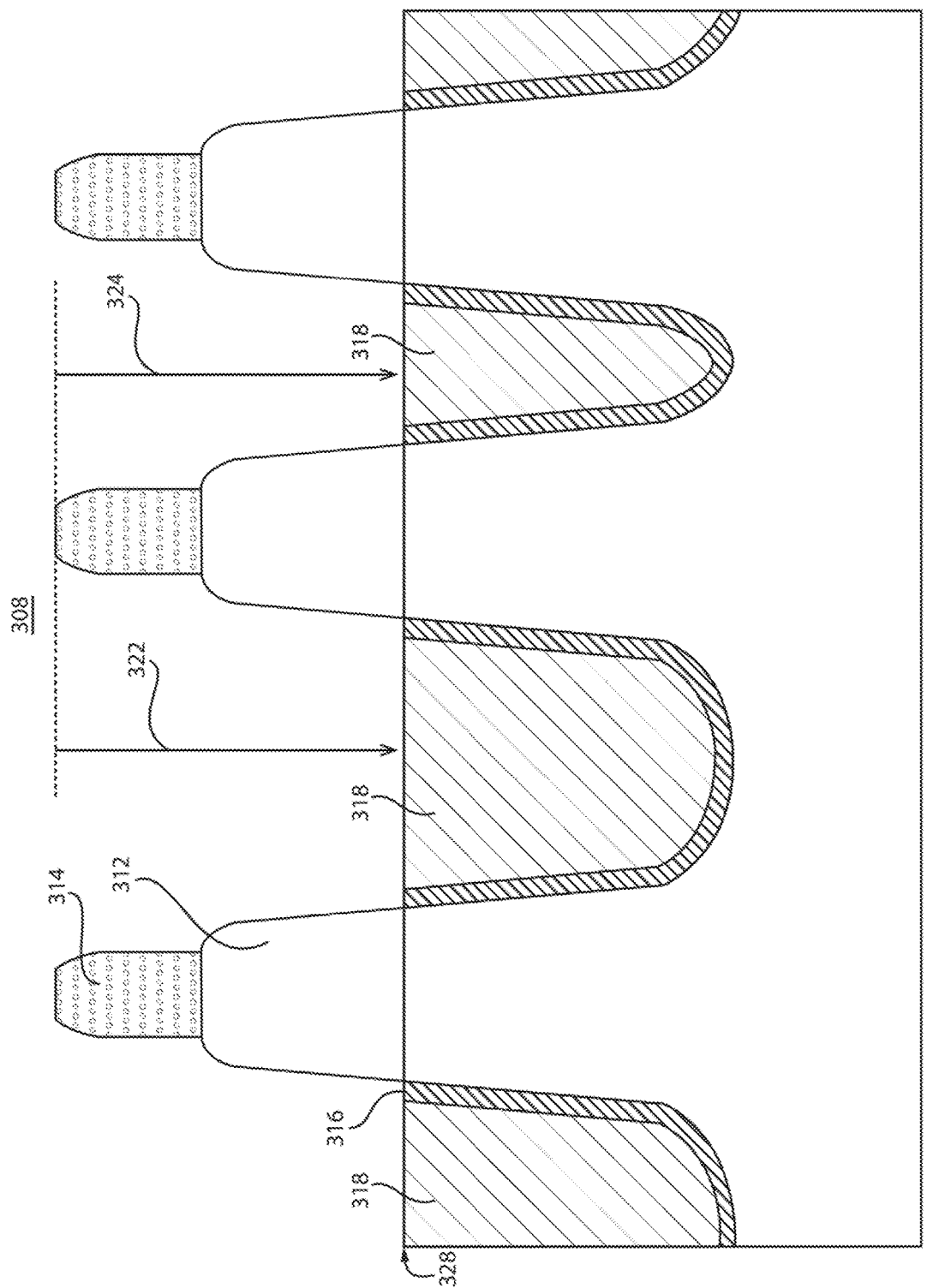

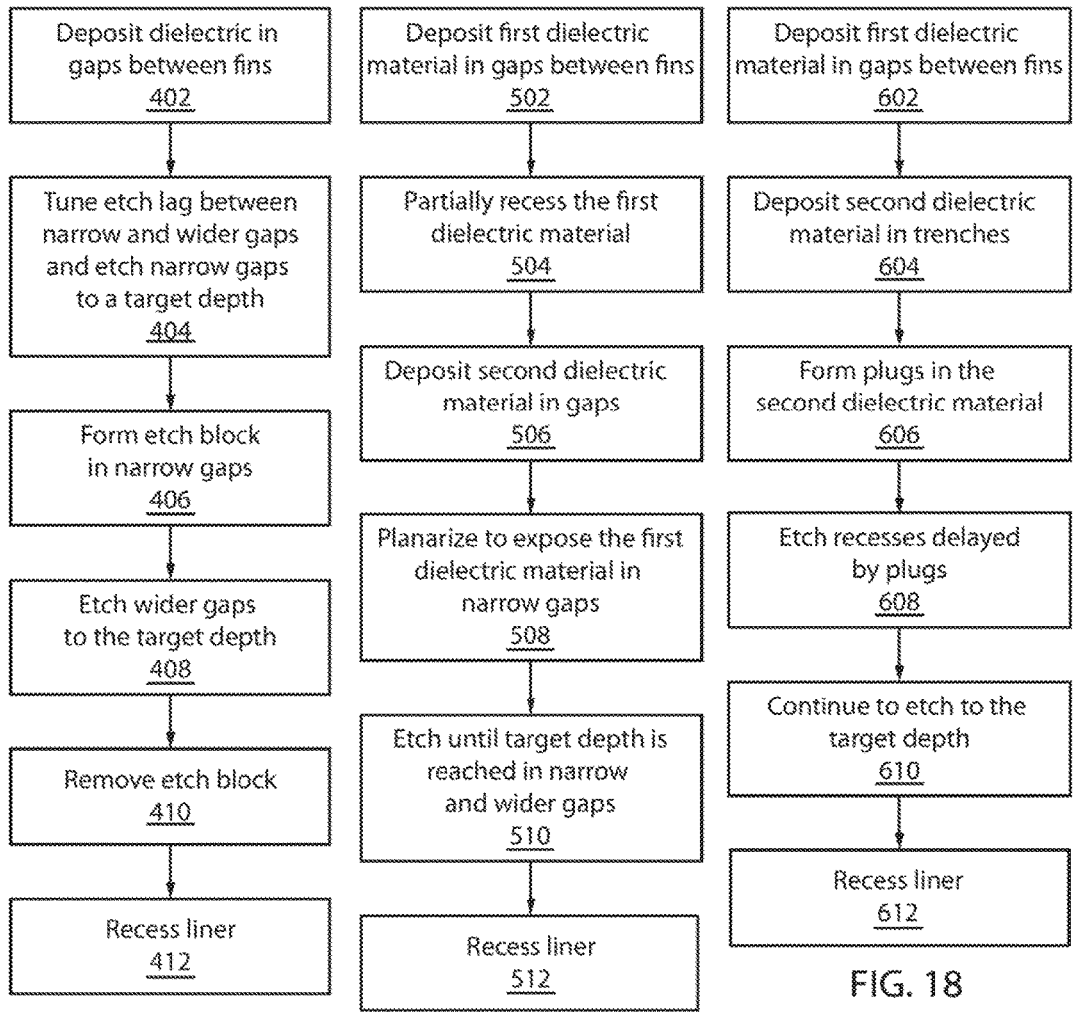

UNIFORM DIELECTRIC RECESS DEPTH DURING FIN REVEAL

BACKGROUND

Technical Field

The present invention relates to semiconductor processing and more particularly to fin reveal etch processes that maintain recess depth of dielectric materials despite gap width between fins.

Description of the Related Art

A reveal process to remove dielectric for fin field effect transistors (finFETs) formation results in different recess depths of surrounding dielectric due to etch lag sensitivity to a fin pattern. Different sized gaps between the fins result in different recess depths thereby exposing different an mints of adjacent fins. Different exposed heights can cause different operating conditions, gate size, variability in control of on-off switching, etc. within the devices created by the fins.

SUMMARY

A method for providing a uniform recess depth between different fin gap sizes includes depositing a dielectric material between fins on a substrate. Etch lag is tuned for etching the dielectric material between narrow gaps faster than the dielectric material between wider gaps such that the dielectric material in the narrow gaps reaches a target depth. An etch block is formed in the narrow gaps. The wider gaps are etched to the target depth. The etch block is removed.

Another method for providing a uniform recess depth between different fin gap sizes includes depositing a first dielectric material between fins on a substrate; partially recessing the first dielectric material in narrow gaps and wider gaps such that the first dielectric material is recessed deeper into the wider gaps; depositing a second dielectric material to fill in the narrow gaps and the wider gaps; planarizing the second dielectric material to expose the first dielectric material in the narrow gaps wherein a layer of the second dielectric material remains in the wider gaps; and recessing the first dielectric material in the narrow gaps and the second dielectric material followed by the first dielectric material in the wider gaps until a target depth is concurrently achieved for the first dielectric material in the narrow gaps and the wider gaps.

Yet another method for providing a uniform recess depth between different fin gap sizes includes depositing, a first dielectric material over and between fins on a substrate, the first dielectric material forming trenches corresponding to wider gaps between the fins; depositing a second dielectric material to fill in the trenches formed in the first dielectric material, the second dielectric material having a higher etch resistance than the first dielectric material; planarizing the second dielectric material and a portion of the first dielectric material above the fins such that the second dielectric material remains only in the trenches to form plugs; etching the first dielectric material and the plugs such that the first dielectric material is recessed into narrow gaps and is delayed by the plugs in the wider gaps until the plugs are removed; and continuing etching of the first dielectric material such that a recess depth of the wider gaps catches up to the recess depth of the narrow gaps until a target depth is concurrently achieved for the first dielectric material in the narrow gaps and the wider gaps.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to following figures wherein:

FIG. 15 is a cross-sectional view of a semiconductor device showing a liner over the fins recessed to a target depth in accordance with the present principles;

FIG. 16 is a block/flow diagram showing a method for providing a uniform recess depth between different fin gap sizes in accordance with one illustrative embodiment;

FIG. 17 is a block/flow diagram showing a method for providing a uniform recess depth between different fin gap sizes in accordance with another illustrative embodiment; and FIG. 18 is a block/flow diagram showing methods for providing a uniform recess depth between different fin gap sizes in accordance with yet another illustrative embodiment.

DETAILED DESCRIPTION

Figure 1:
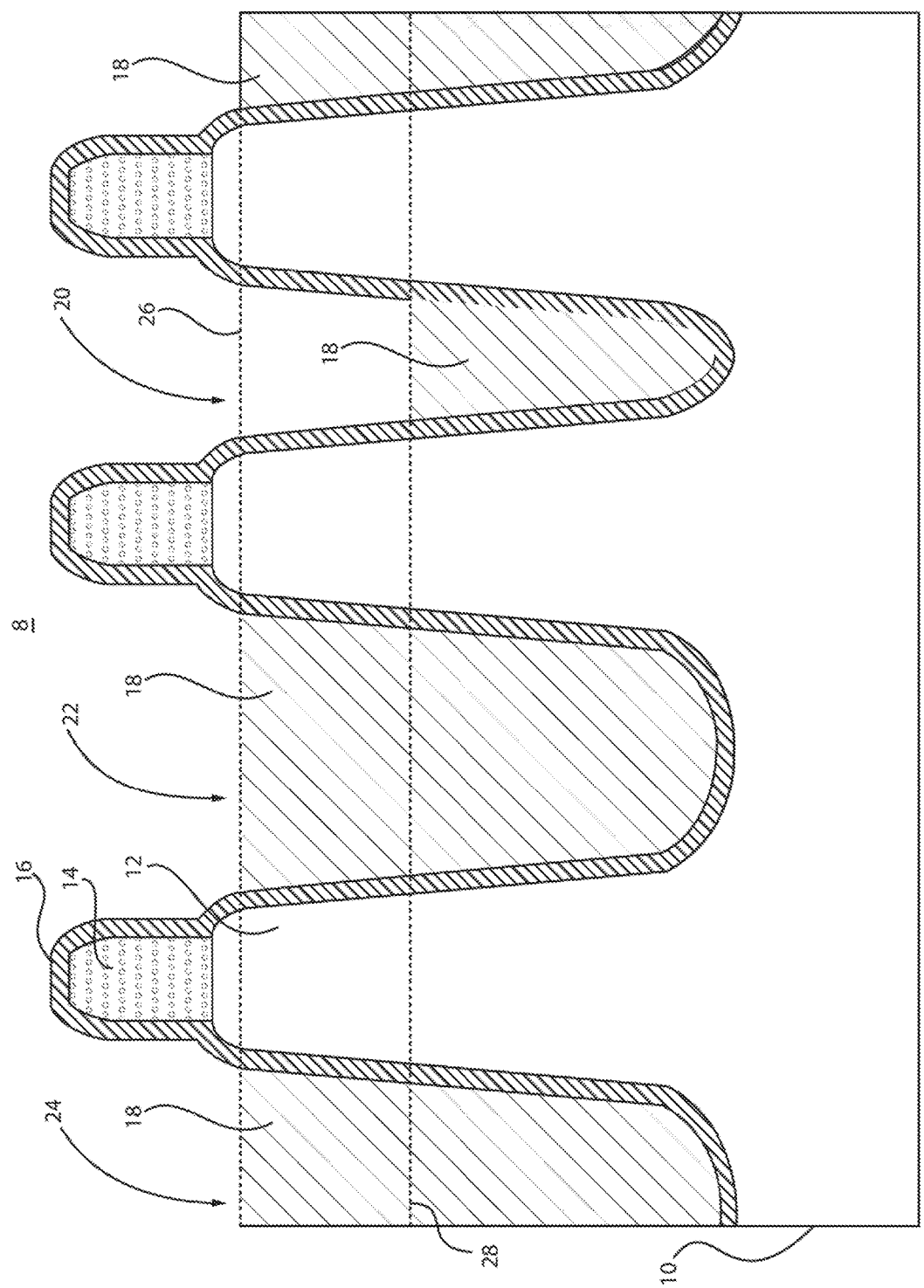
FIG. 1 is a cross-sectional view of a semiconductor device having fins with narrow and wide gaps therebetween and a dielectric layer etched to a target depth in the narrow gaps in accordance with the present principles.

In accordance with the present principles, methods for improved uniformity of dielectric height between fins due to recessing are provided for semiconductor applications. The present principles may be employed on any fin type of material, e.g., the fins may include Si, SiGe, III-V material, combinations of these and other materials, etc. The dielectric being recessed may include any suitable dielectric material disposed between the fins, and in one embodiment, includes a silicon oxide or any other silicon-based dielectric.

In one embodiment, a capillary polymer is employed to preferentially block narrow openings to protect from further etching to reduce discrepancies between wider and narrow opening recesses. Reactive ion etching (RIE) may be employed to etch narrow features faster to reach a global target depth. Then, the capillary polymer is deposited, which wicks into narrower recess features and resists the RIE. The RIE is continued to further etch the wide features. The polymer is then stripped using a chemical wet removal or RIE process. Since the dielectric material in the narrow gaps was recessed faster and therefore deeper using reverse RIE lag with the capillary polymer, the removal of the capillary polymer provides equal dielectric recess depth in both narrow and wider gaps to achieve recess control.

In another embodiment, a sacrificial nitride (or other material) is deposited on a partially recessed fin/dielectric substrate to fill variable recesses with nitride (e.g., SiN). The device is planarized to stop on the dielectric so only wide features are still blocked by nitride and to reveal only the narrow features. The etch chemistry etches the nitride at a slower rate, permitting the etch of wide features to lag behind that of narrow features. A partially selective (oxide over nitride) RIE may be employed to etch narrower areas faster; then, once the nitride is removed, the selectivity reverses to make all recesses more uniform. The etch rate preferences are reversed to achieve a uniform recess level for the dielectric material.

Dielectric recess control for a finFET reveal is advantageously performed without dopant material. Intentional doping while altering etch rate in specific regions may cause damage to fin liners or other components.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., $Si_xGe_{1-x}$ where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 8 is shown in accordance with one illustrative embodiment. The device 8 hides a plurality of fins 12 etched, or otherwise patterned into a substrate 10. While the present principles will be described in terms of fins, the present principles may be applicable to any undulating or repetitive structure having different gaps or pitches therebetween. The substrate 10 may include a monocrystalline substrate, such as Si, Ge, SiGe, III-V materials, etc. In other embodiments, the substrate 10 may include other materials such a glass, quartz, metal, etc. The fins 12 may be etched into the substrate 10 and may include narrow gaps 20, large gaps 22 and a field region 24. These different gaps or regions indicate relate size differences in the distances between adjacent fins 12 (gaps). The field region 24 being a larger gap, than the large gap 22, and the large gap 22 being a larger gap than the narrow gap 20. It should be understood that a plurality of different sized gaps may be present (two or more sizes, e.g., wider).

The fins 12 may have a spacer 14 or other dielectric formed thereon. The spacer 14 may have been employed as an etch mask for the formation of the fins 12. The spacer 14 may include an oxide or a nitride material. A liner 16 may be conformally formed over the spacer 14 and the fins 12. The liner 16 may include a nitride material, although other materials may be employed.

A dielectric 18 is deposited over the device 8 and is recessed using a reactive ion etch process (RIE) or other suitable recess process. The dielectric 18 may include an oxide, although other materials may be employed. The RIE recesses the dielectric 18 between the fins 12. However, due to the different gaps between the fins 12, the recess depth is different depending on the gap size. The etch depth rate is much higher for the narrow gaps 20 than for the field region 24 and the large gap 22.

In accordance with the present principles, the RIE is carried out so that the narrow gaps 20 reach a global target recess depth 28 faster. The large gaps 22 and field region 24 include a recess depth 26 that is far behind the global target recess depth 28. This may be provided by tuning RIE lag using RIE chemistries or process conditions to a achieved a faster etch rate of dielectric 18 in narrow gaps 20, by, for example, adding more $CO_2$, into the etching gas chemistry.

Figure 2:
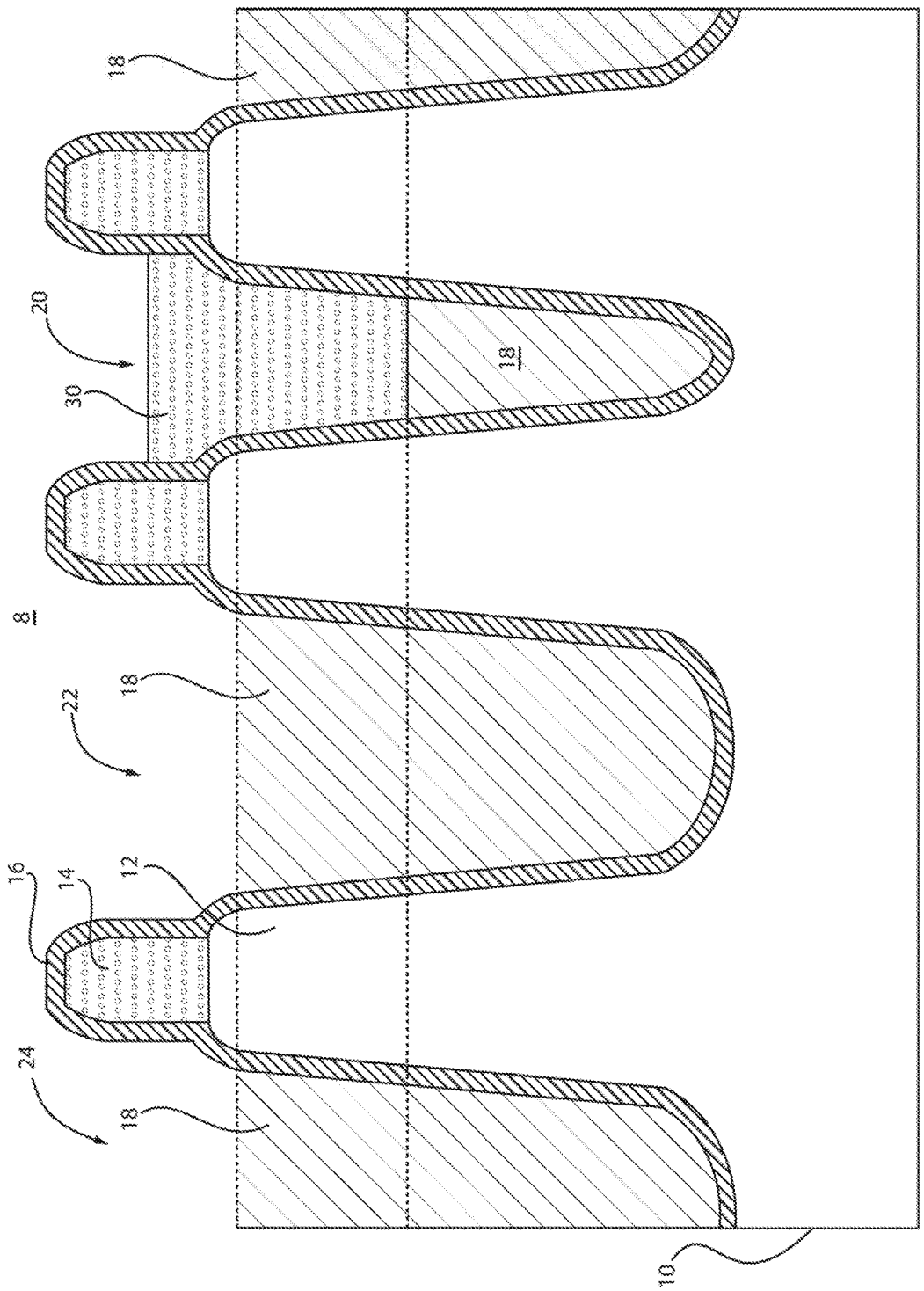
FIG. 2 is a cross-sectional view of the semiconductor device of FIG. 1 having an etch block forted selectively in the narrow gaps in accordance with the present principles.

Referring to FIG. 2, an etch block 30 is formed in the narrow gaps 20 to prevent further recessing. The etch block 30 may include a capillary polymer, such as, e.g., polystyrene or other material that strongly resists the etching process to recess the dielectric 18. For example, the dielectric 18 is highly selectively removable relative to the etch block material. Using a capillary polymer for the etch block 30, only narrow gaps 20 are filled due to the nature of the polymer. The narrow gaps 20 are now protected from further etching.

Figure 3:
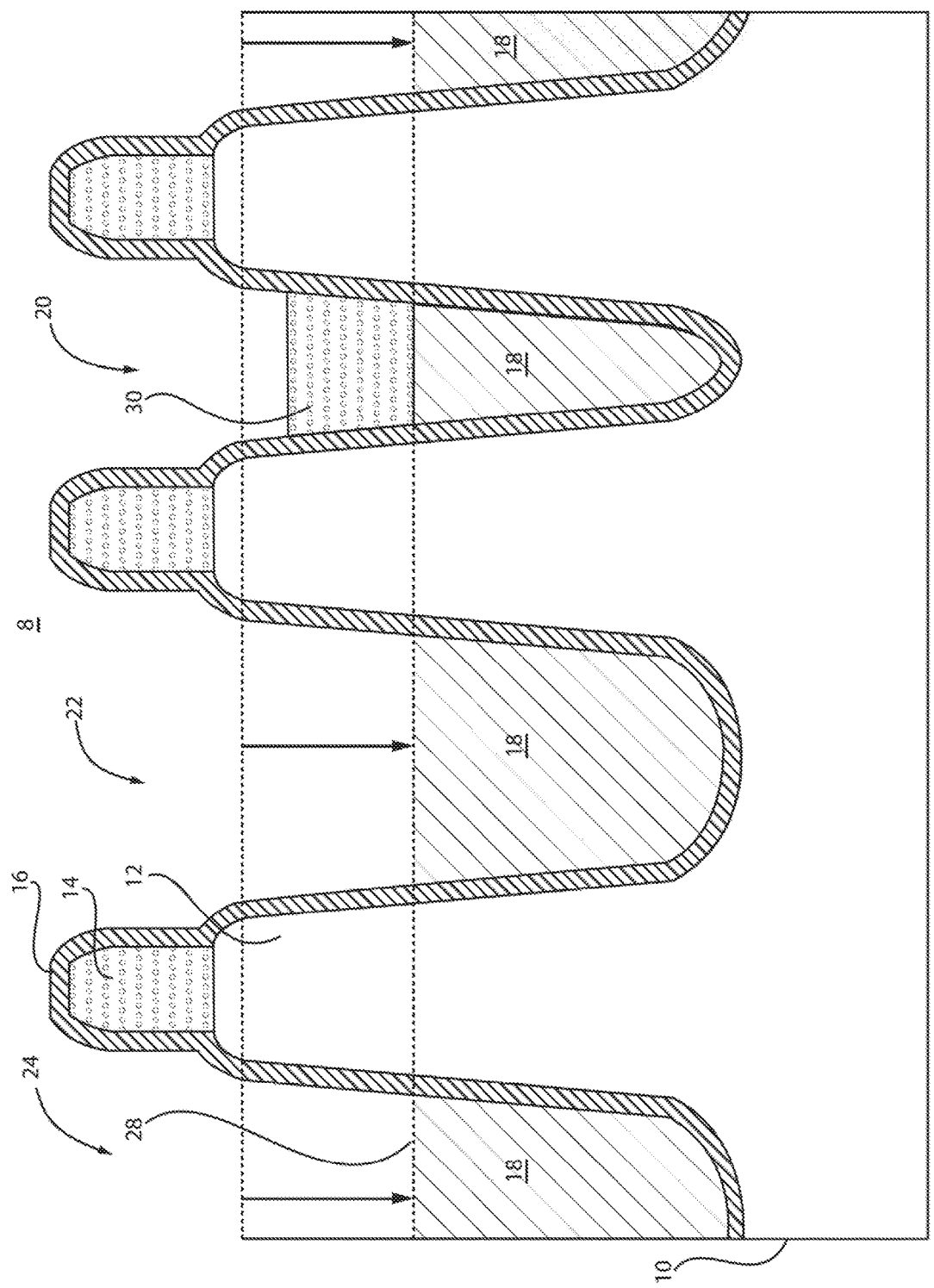
FIG. 3 is a cross-sectional view of the semiconductor device of FIG. 2 showing the dielectric in the wider gaps etched to the target depth in accordance with the present principles.

Referring to FIG. 3, the RIE recess process is continued to etch the large gaps 22 and the field regions 24 down to the global target recess depth 28. The etch block 30 protects the dielectric 18 in the narrow gaps 20 from further recessing.

Figure 4:
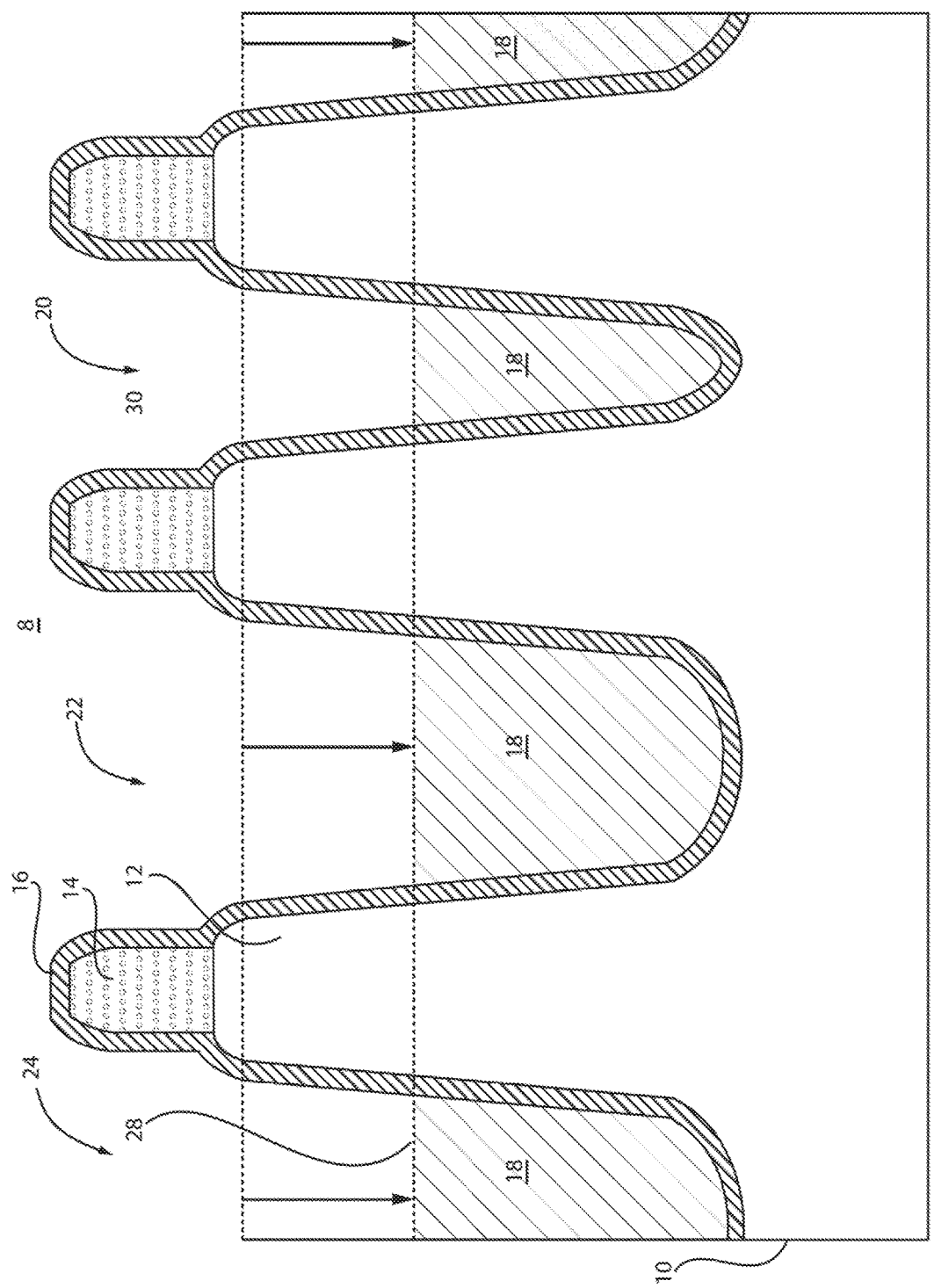
FIG. 4 is a cross-sectional view of the semiconductor device of FIG. 3 showing the etch block removed and the dielectric in the narrow and wider gaps recessed to the target depth in accordance with the present principles.

Referring to FIG. 4, the etch block 30 is removed from the narrow gaps 20. The recess depth of the dielectric 18 is uniform across all feature sizes down to the global target recess depth 28.

Figure 5:
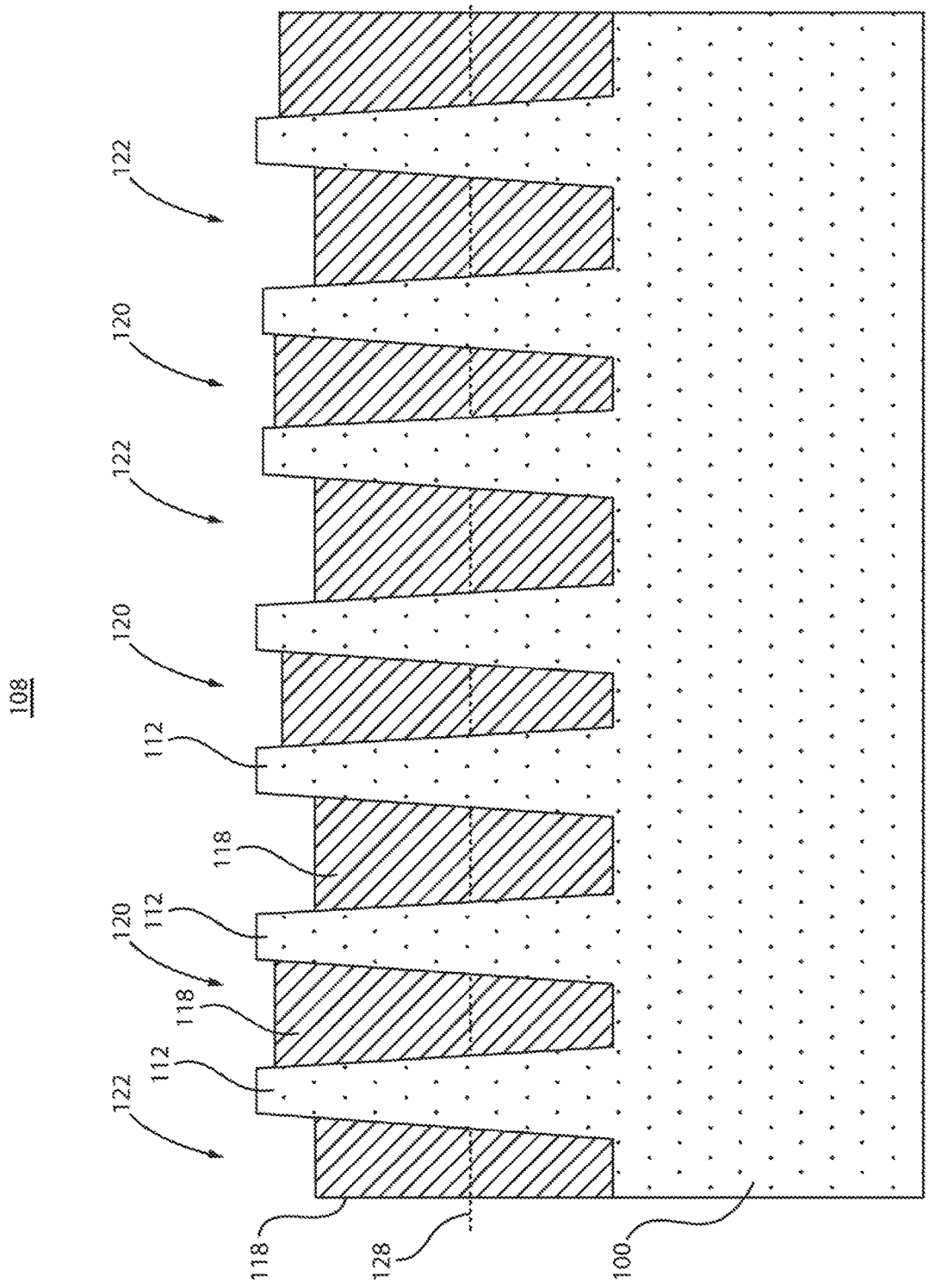
FIG. 5 is a cross-sectional view of a semiconductor device having fins with narrow and wide gaps therebetween and a dielectric layer partially recessed in the narrow and wider gaps in accordance with the present principles.

Referring to FIG. 5, another embodiment will be described to provide a uniform recess height for a device 108. Fins 112 are formed in a substrate 100 (similar to substrate 10 in FIG. 1) as before, and a dielectric 118 is formed in gaps between the fins 112. The dielectric 118 may be the same as dielectric 118. The fins 112 are depicted without spacers and liners but may include these structures as well. The dielectric 118 has been recessed by a RIE process, chemical mechanical polishing (CMP), wet chemical etching, and as a result, different recess depths (deeper recess in wider features) are obtained depending on gap distances 120, 122 between the fins 112. Gap 120 is narrower than gap 122. It should be understood that a greater number of gap sizes may also be employed with the present principles. A global target recess depth 128 is depicted for reference.

Figure 6:
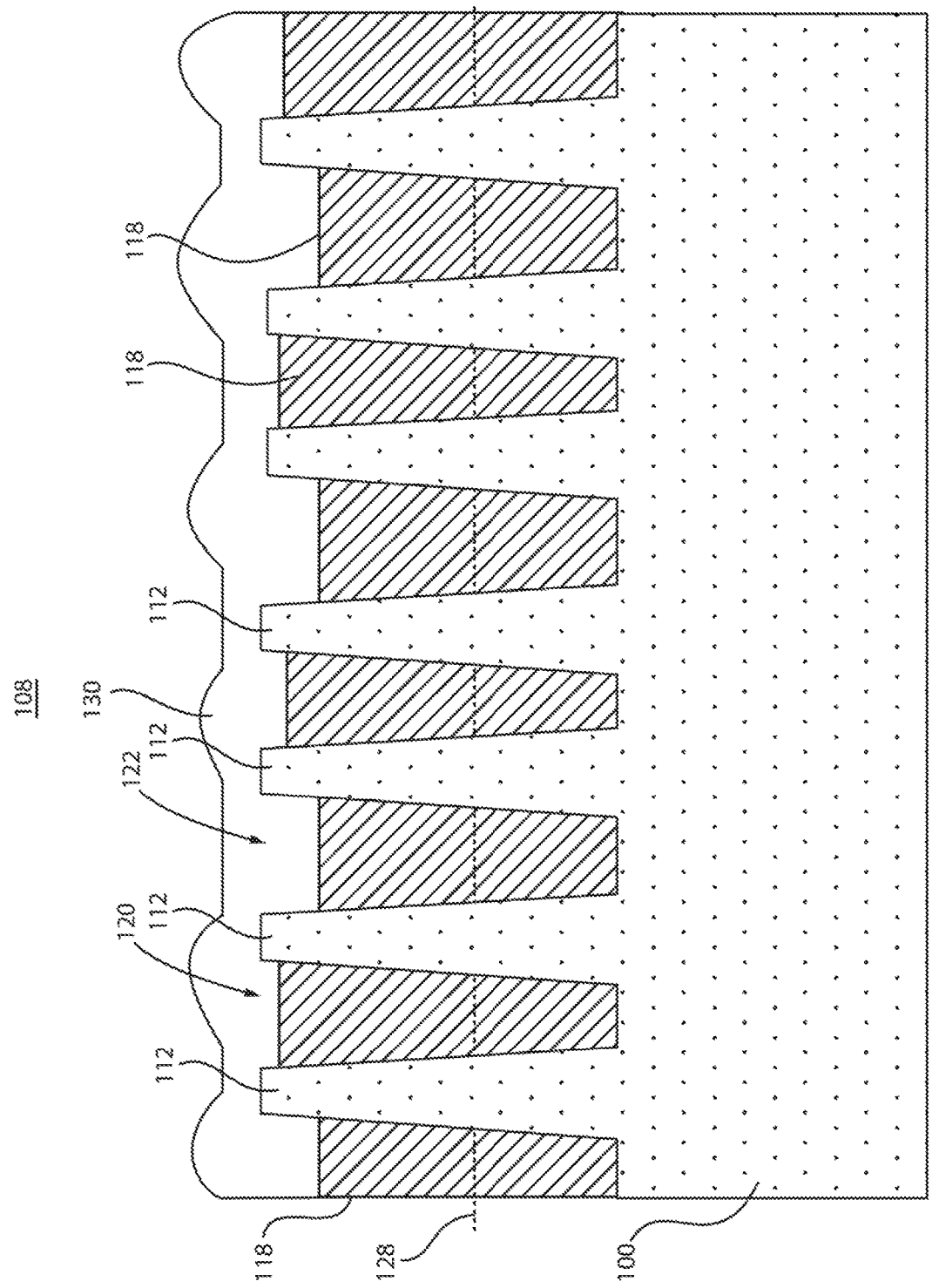
FIG. 6 is a cross-sectional view of the semiconductor device of FIG. 5 having a second dielectric material formed in the narrow and wider gaps in accordance with the present principles.

Referring to FIG. 6, a recess fill material 130 is deposited over the device 108. The recess fill material 130 may include a nitride, such as a silicon nitride. The recess fill material 130 fills in all of the recesses in all of the gaps 120, 122.

Figure 7:
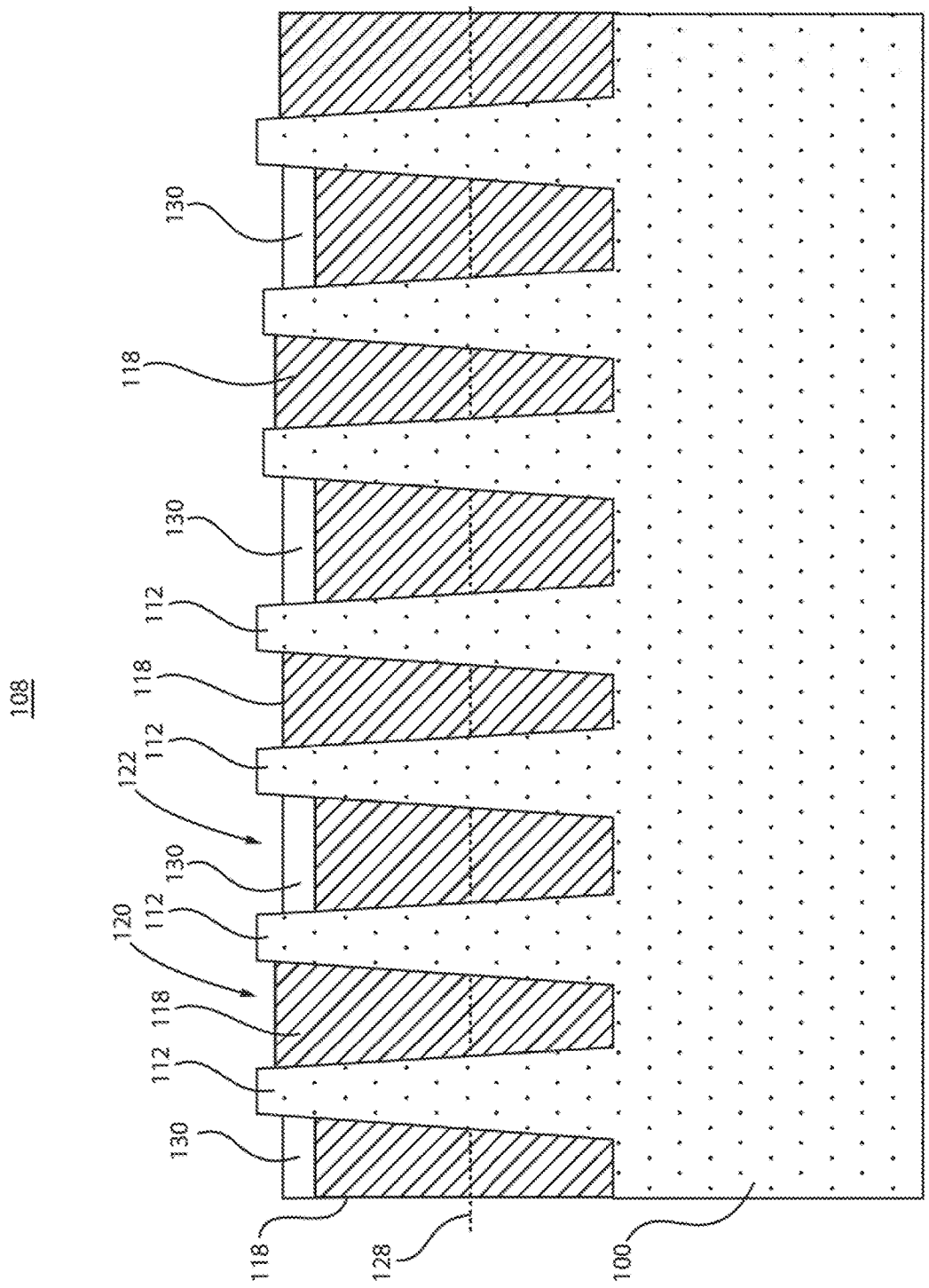
FIG. 7 is a cross-sectional view of the semiconductor device of FIG. 6 showing the second dielectric material in the wider gaps and removed from the narrow gaps in accordance with the present principles.

Referring to FIG. 7, a planarizing process is performed (e.g., CMP) on the recess fill material 130, which stops near tops of the fins 112 to planarize and reveal only small gaps which contain less recess fill material 130. Now, the dielectric 118 is exposed only in narrow gaps 120. The wider gaps 122 include a layer of the fill material 130 since these gaps 122 included a deeper recess for the dielectric 118.

Figure 8:
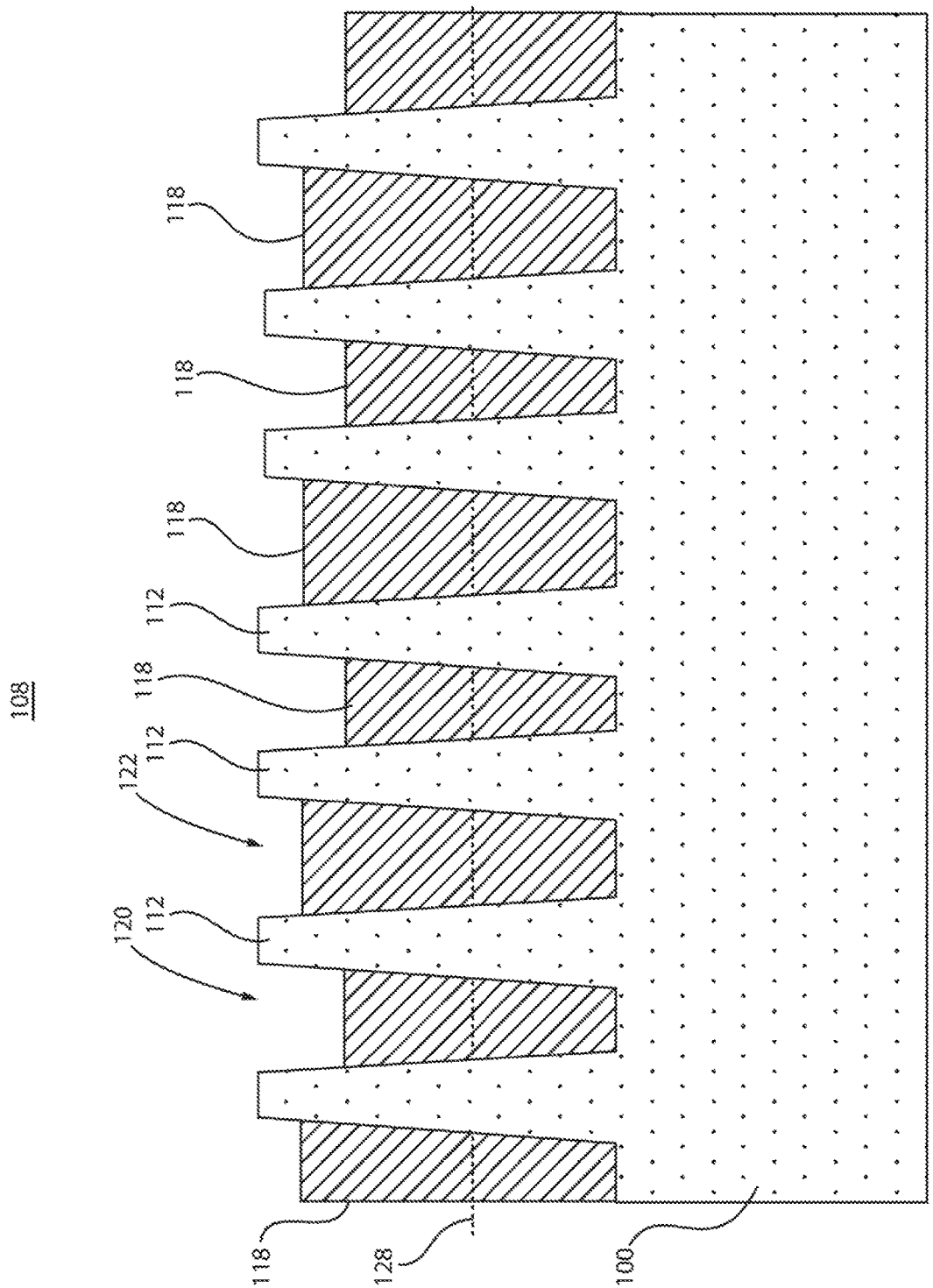
FIG. 8 is a cross-sectional view of the semiconductor device of FIG. 7 showing the dielectric in the narrow and wider gaps recessed in accordance with the present principles.

Referring to FIG. 8, RIE is performed to etch the material in the gaps 120, 122. The exposed dielectric 118 in the narrower gaps 120 will etch faster than gaps 122 plugged with fill material 130. The RIE is partially selective to dielectric 118, so the dielectric 118 is favorably removed, but fill material 130 is still removed at a slower rate. As the RIE continues, the fill material 130 is fully etched. Dielectric 118 in wide gaps 122 has less recess depth than the narrow gaps 120, but no material fill 130 remains. Dielectric 118 in the wide gaps will etch faster than the narrow gaps 120 with continued RIE.

Figure 9:
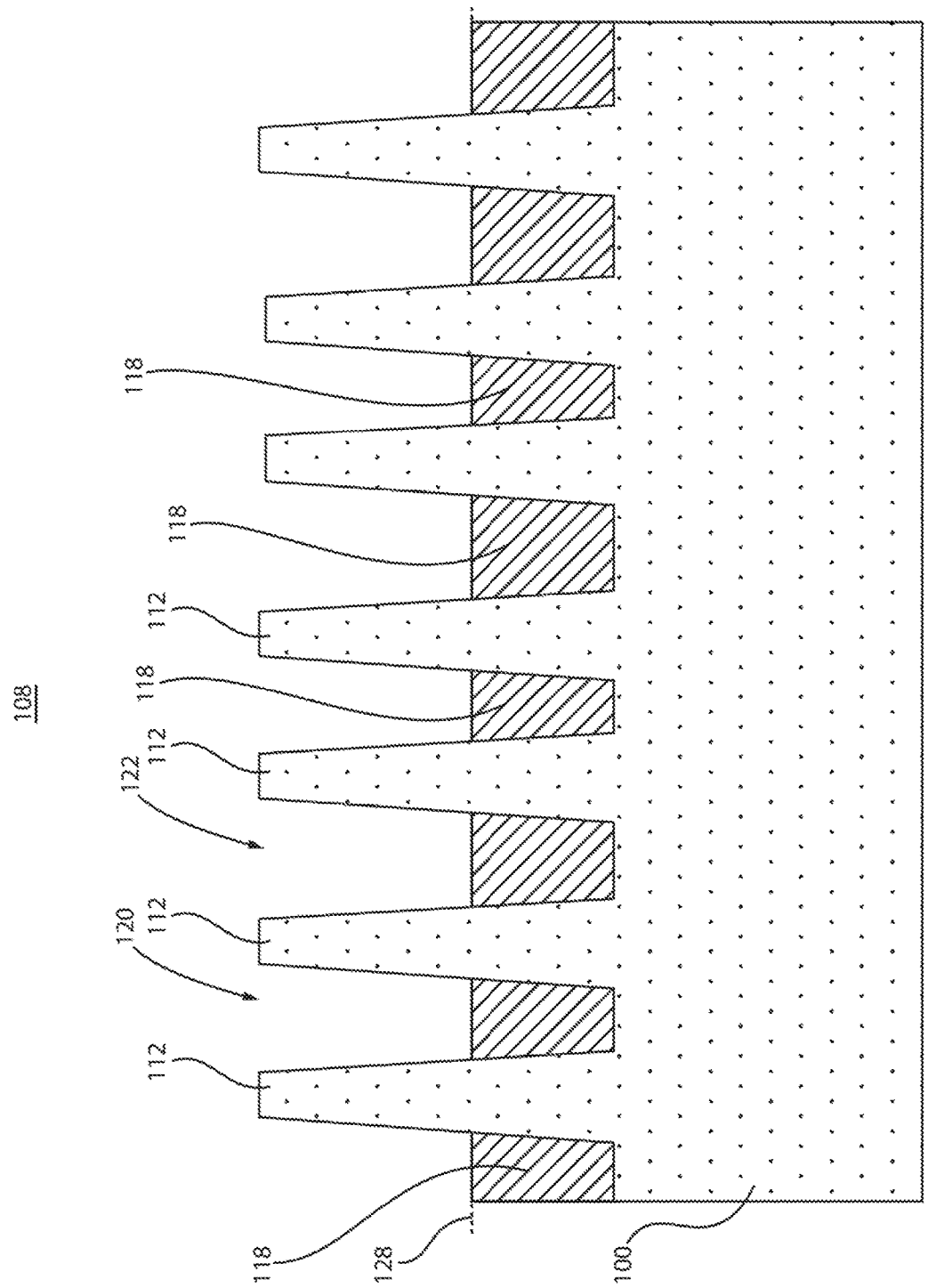
FIG. 9 is a cross-sectional view of the semiconductor device of FIG. 8 showing the dielectric in the narrow and wider gaps recessed to a target depth in accordance with the present principles.

Referring to FIG. 9, with the material fill 130 gone, RIE lag resumes as expected with wide gaps 122 etching faster than narrow gaps 120. When the target depth 128 is reached, wide gaps 122 and narrow gaps 120 have, similar dielectric recess depths (128).

Figure 10:
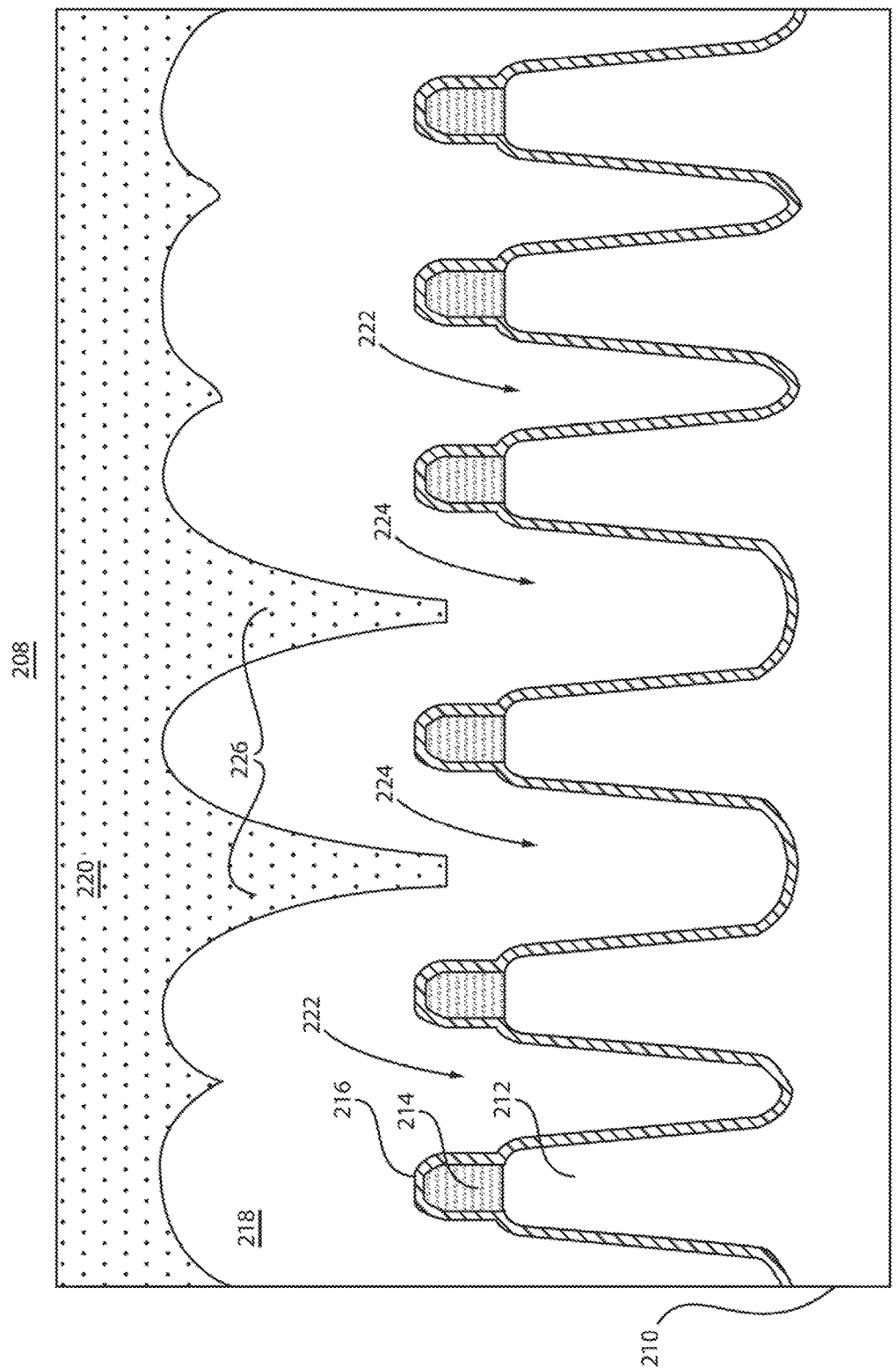
FIG. 10 is a cross-sectional view of a semiconductor device having fins with narrow and wider gaps therebetween, a first dielectric layer forming trenches therein and a second dielectric layer filling the trenches in the wider gaps in accordance with the present principles.

Referring to FIG. 10, a device 208 includes fins 212 etched into a substrate 210, which may include narrow gaps 222 and large gaps 224. These different gaps indicate relative size differences in the distances between adjacent fins 212 (gaps). The large gaps 224 are larger than the narrow gaps 222. It should be understood that a plurality of different sized gaps may be present (two or more sizes).

The fins 212 may have a spacer 214 or other dielectric formed thereon. The spacer 214 may have been employed as an etch mask for the formation of the fins 212. The spacer 214 may include an oxide or a nitride material. A liner 216 may be conformity formed over the spacer 214 and the fins 212. The liner 216 may include, a nitride material, although other materials may be employed.

A dielectric 218 is deposited over the device 208. The dielectric 218 has a top surface that takes the shape of the underlying fins 212. A dielectric layer 220 is formed over the top surface of the dielectric 218 and fills in gaps 226 in the dielectric 218. The gaps 226 are formed only over wider or large gaps 224. The dielectric layer 220 includes a material that has greater etch resistance to an RIE process that will be employed to recess the dielectric 218. In one embodiment, the dielectric layer 220 includes nitride while the dielectric 218 includes an oxide.

Figure 11:
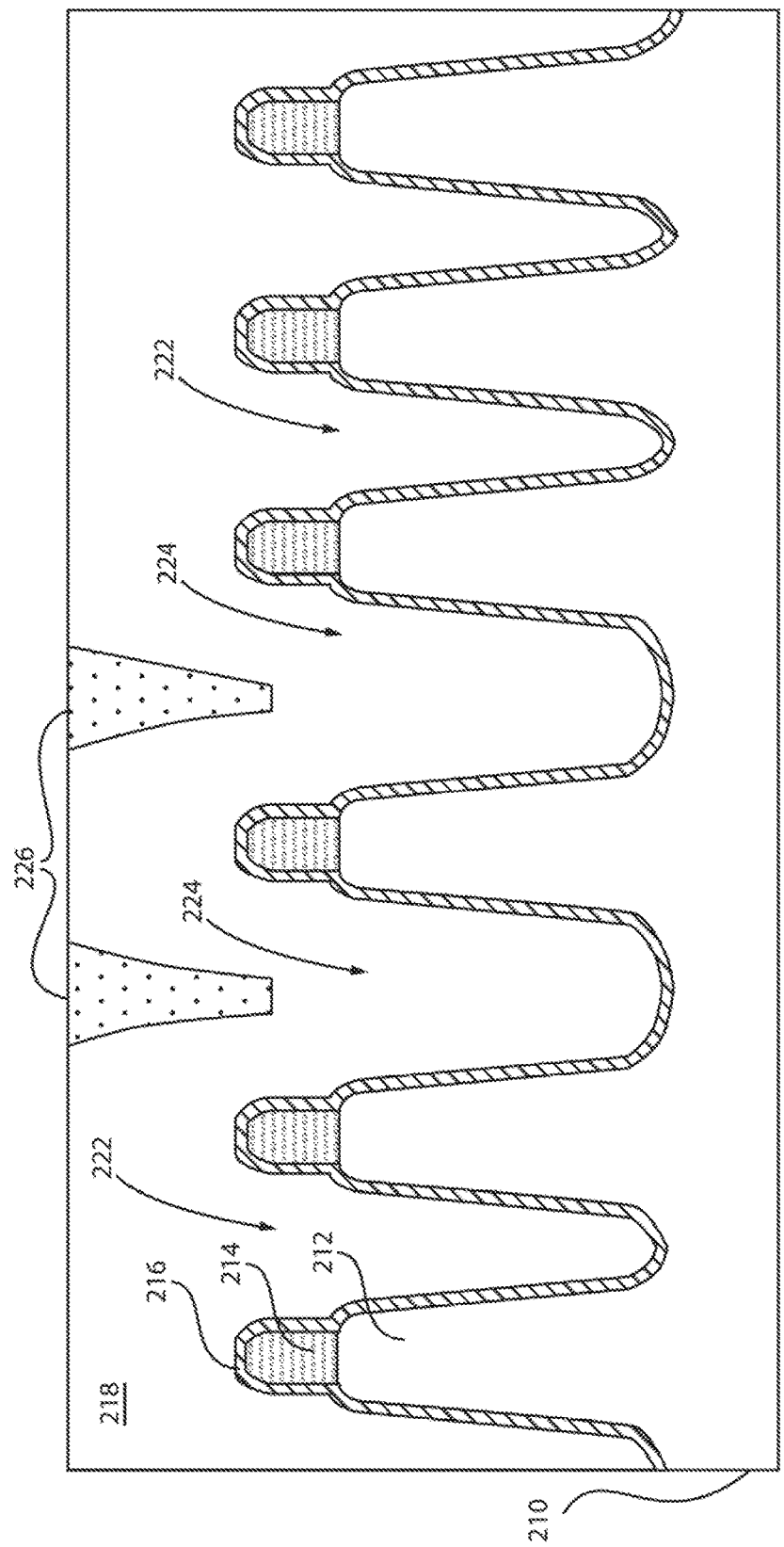
FIG. 11 is a cross-sectional view of the semiconductor device of FIG. 10 after planarization to form plugs from the second dielectric material over the wider gaps in accordance with the present principles.

Referring to FIG. 11, a top surface of the dielectric layer 220 and dielectric 218 is planarized using a CMP, RIE or similar processes. The CMP/RIE removes most of the dielectric layer 220 except for portions or plugs 226 over the wider gaps 224.

Figure 12:
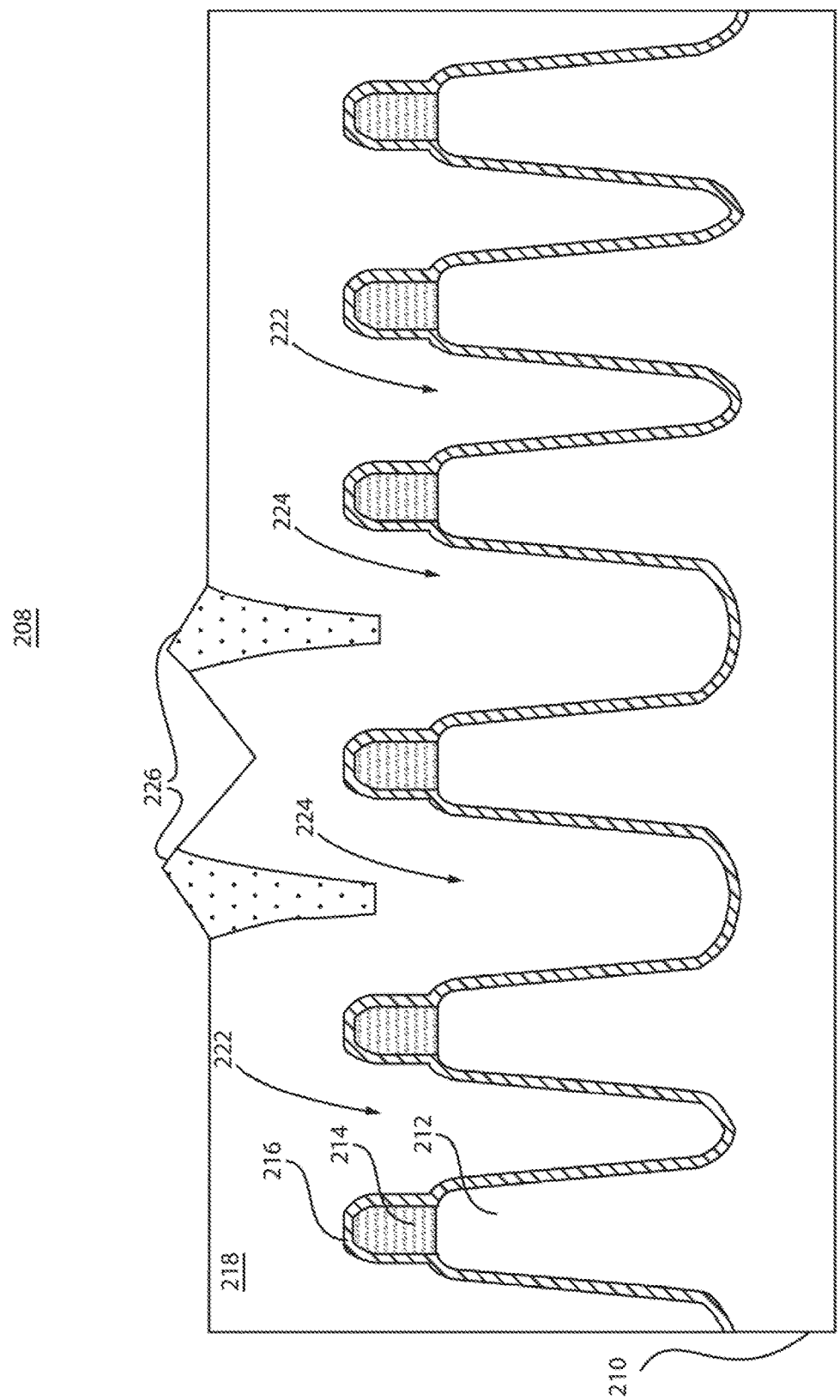
FIG. 12 is a cross-sectional view of the semiconductor device of FIG. 11 showing the first dielectric material etched wherein the etch rate is slowed by the plugs in accordance with the present principles.

Referring to FIG. 12, a RIE process removes the areas with portions 226 at a slower rate than the dielectric 218 over narrow gaps 222. The etch resistance of the portions 226 maintains more material for a longer duration over the wider gaps 224.

Figure 13:
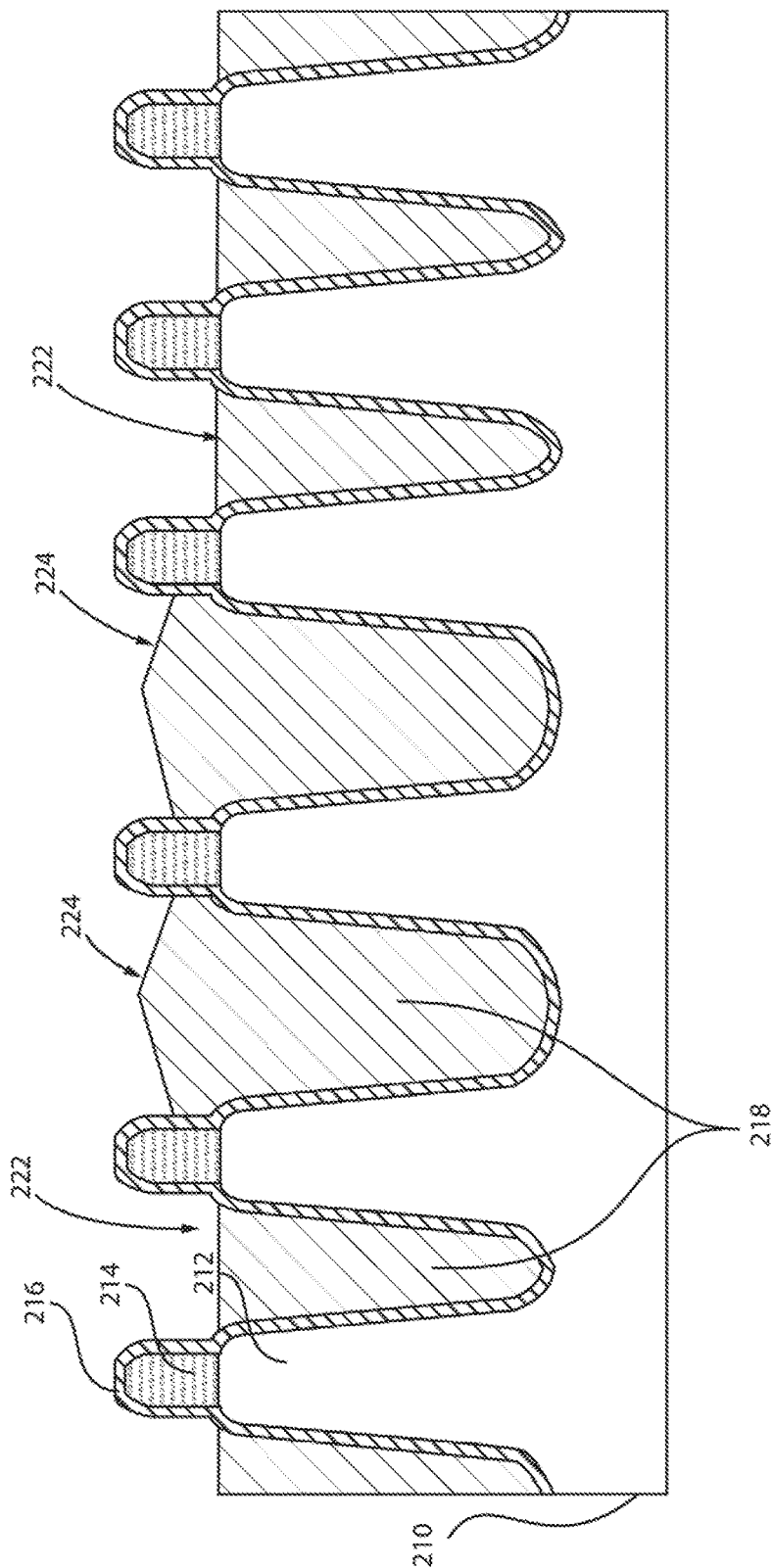
FIG. 13 is a cross-sectional view of the semiconductor device of FIG. 12 showing the first dielectric further etched with the recess depth of the wider gaps catching up to that of the narrow gaps in accordance with the present principles.

Referring to FIG. 13, the slower etch material of the portions 226 is removed as the RIE continues. Now, the RIE proceeds at a faster rate, in the wider gaps 224 and will begin catching up to the depth of the dielectric 218 in the narrower gaps 222.

Figure 14:
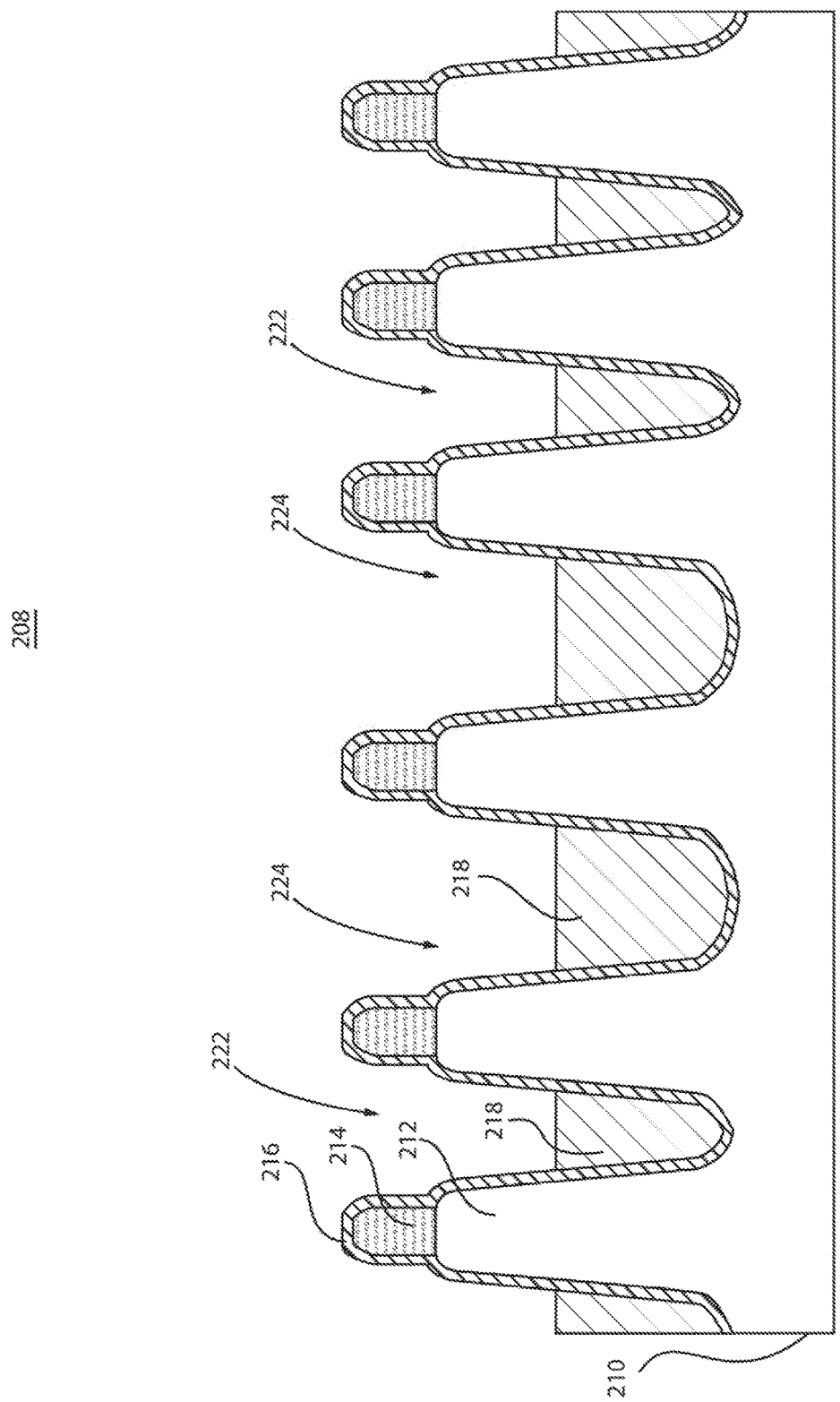
FIG. 14 is a cross-sectional view of the semiconductor device of FIG. 13 showing the first dielectric material in the narrow and wider gaps recessed to a target depth in accordance with the present principles.

Referring to FIG. 14, RIE lag resumes as expected with wide gaps 224 etching faster than narrow gaps 222. When the target depth 228 is reached, wide gaps 224 and narrow gaps 222 have similar dielectric recess depths (228).

Referring to FIG. 15, devices 8, 108 and 208 may include fins, spacers, liners, as depicted or in other configurations with wider and narrower gaps. Devices 8, 108 and 208 may include the same or different, materials for the components described. For all process flows, once the depth levels 322 and 324 are achieved, the liner 316 is removed down to the level 328 to expose fins 312 and spacers 314. All process flows for devices 8, 108 and 208 provide a uniform recess depth 328 regardless of spacing variations between fins 312.

Referring to FIGS. 16-18, block/flow diagrams are illustratively depicted for methods in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 16, a method for providing a uniform recess depth between different fin gap sizes is shown in accordance with one embodiment. In block 402, a dielectric material is deposited between fins on a substrate. The fins may be etched from the substrate and may include one or more of Si, SiGe, III-V materials or combinations thereof. In block 404, etch lag is tuned for etching the dielectric material between narrow gaps faster than the dielectric material between wider gaps such that the dielectric material in the narrow gaps reaches a target depth. Tuning etch lag may include altering a chemistry or a condition of a reactive ion etch process to etch the dielectric material faster. In one embodiment, tuning the etch chemistry may include tuning and amount of $CO_2$ injected into a processing chamber to alter the etch rate. Other etching chemistries and concentrations may also be employed for the tuning process.

In block 406, an etch block is formed in the narrow gaps. The etch block formation may include forming a capillary polymer (e.g., polystyrene) selectively in the narrow gaps. In block 408, the wider gaps are etched to the target depth. In block 410, the etch block is removed. In block 412, the fins may include a liner formed thereon, and the dielectric material may be etched relative to the liner. The liner may be recessed to the target depth.

Referring to FIG. 17, another method for providing a uniform recess depth between different fin gap sizes is shown in accordance with another embodiment. In block 502, a first dielectric material is deposited between fins on a substrate. The fins may be etched from the substrate. The fins may include one or more of Si, SiGe, III-V materials or combinations thereof.

In block 504, the first dielectric material is partially recessed in narrow gaps and wider gaps such that the first dielectric material is recessed deeper into the wider gaps. The partial recess may include performing one of a reactive ion etch, a chemical mechanical polish or a wet chemical etch removal process.

In block 506, a second dielectric material is deposited to fill in the narrow gaps and the wider gaps. In one embodiment, the first dielectric material includes an oxide and the second dielectric material includes a nitride.

In block 508, the second dielectric material is planarized to expose the first dielectric material in the narrow gaps where a layer of the second dielectric material remains in the wider gaps. In block 510, the first dielectric material, in the narrow gaps, and the second dielectric material, followed by the first dielectric material in the wider gaps, are recessed until a target depth is concurrently achieved fir the first dielectric material in the narrow gaps and the wider gaps. The recessing may include reactive ion etching with an etch lag wherein the wider gaps lag behind the narrow gaps. A liner over the fins may be recessed in block 512.

Referring to FIG. 18, another method for providing a uniform recess depth between different fin gap sizes is shown in accordance with yet another embodiment. In block 602, a first dielectric material is deposited over and between fins on a substrate. The first dielectric material forms trenches corresponding to wider gaps between the fins. The fins may be etched from the substrate. The fins may include one or more of Si, SiGe, III-V materials or combinations thereof.

In block 604, a second dielectric material is deposited to fill in the trenches formed in the first dielectric material. The second dielectric material has a higher etch resistance than the first dielectric material. The first dielectric material may include an oxide, and the second dielectric material may include a nitride.

In block 606, the second dielectric material and a portion of the first dielectric material above the fins are planarized such that the second dielectric material remains only in the trenches to form plugs. In block 608, the first dielectric material and the plugs are etched (e.g., RIE) such that the first dielectric material is recessed into narrow gaps, and the etch is delayed by the plugs in the wider gaps until the plugs are removed. In block 610, etching of the first dielectric material is continued such that a recess depth of the wider gaps catches up to the recess depth of the narrow gaps until a target depth is concurrently achieved for the first dielectric material in the narrow gaps and the wider gaps. This may include reactive ion etching with an etch lag wherein the narrow gaps lag behind the wider gaps. In block 612, the fins may include a liner, and the liner is recessed to the target depth.

Having described preferred embodiments for uniform dielectric recess depth during fin reveal (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for providing a uniform recess depth between different fin gap sizes, comprising:
   tuning reactive ion etch lag for etching a dielectric material, between fins on a substrate, between narrow gaps faster than the dielectric material between wider gaps such that the dielectric material in the narrow gaps reaches a target depth; and
   etching the dielectric material in the wider gaps to the target depth.

2. The method as recited in claim 1, wherein tuning the reactive ion etch lag includes altering a chemistry or a condition of a reactive ion etch.

3. The method as recited in claim 1, wherein the fins include a liner formed thereon and the dielectric material is etched relative to the liner.

4. The method as recited in claim 3, further comprising recessing the liner to the target depth.

5. The method as recited in claim 1, wherein the fins are etched from the substrate.

6. The method as recited in claim 1, wherein the fins include one or more of Si, SiGe, III-V materials or combinations thereof.

7. The method as recited in claim 1, further includes forming an etch block in the narrow gaps.

8. The method as recited in claim 7, further includes removing the etch block.

9. The method as recited in claim 7, wherein forming the etch block includes forming a capillary polymer selectively in the narrow gaps.

10. The method as recited in claim 9, further includes removing the etch block.

* * * * *